(12) United States Patent
Shibata

(10) Patent No.: US 7,872,519 B2
(45) Date of Patent: Jan. 18, 2011

(54) VOLTAGE DIVIDER CIRCUIT

(75) Inventor: Kimio Shibata, Austin, TX (US)

(73) Assignee: Seiko Instruments Inc., Chiba (JP)

( * ) Notice: Subject to any disclaimer, the term of this patent is extended or adjusted under 35 U.S.C. 154(b) by 9 days.

(21) Appl. No.: 12/417,455

(22) Filed: Apr. 2, 2009

(65) Prior Publication Data

US 2009/0261866 A1    Oct. 22, 2009

Related U.S. Application Data

(60) Provisional application No. 61/046,990, filed on Apr. 22, 2008.

(51) Int. Cl.
*G05F 1/10* (2006.01)
*G05F 3/02* (2006.01)

(52) U.S. Cl. .................. 327/541; 327/543

(58) Field of Classification Search .......... 327/538, 327/540, 541, 543; 323/315, 316
See application file for complete search history.

(56) References Cited

U.S. PATENT DOCUMENTS 5,300,837 A * 4/1994 Fischer .................. 327/281

6,686,798 B2 * 2/2004 Gaggl ..................... 327/540
6,979,990 B2 * 12/2005 Lee ....................... 323/316
2006/0001476 A1 * 1/2006 Yanagisawa et al. ...... 327/538

FOREIGN PATENT DOCUMENTS

JP          2-250514 A      10/1990

* cited by examiner

*Primary Examiner*—Quan Tra
(74) *Attorney, Agent, or Firm*—Brinks Hofer Gilson & Lione

(57) ABSTRACT

Provided is a voltage divider circuit for dividing an input voltage in accordance with a predetermined ratio with high accuracy, in which a source current does not flow from a voltage source and a sink current does not flow into the voltage source. The voltage divider circuit according to the present invention includes: a first resistor; a constant current circuit for outputting a current flowing through the first resistor correspondingly to an input voltage as a constant current; a first current mirror circuit, in which the constant current becomes an input current, for outputting a first output current; a second current mirror circuit, in which the first output current becomes an input current, for outputting a second output current; and a second resistor connected to an output terminal to which the second output current of the second current mirror circuit is output, in which a divided voltage, which is a potential difference between both ends of the second resistor, is adjusted by a current mirror ratio between the first current mirror circuit and the second current mirror circuit, and a resistance ratio between the second resistor and the first resistor.

5 Claims, 3 Drawing Sheets

VOLTAGE DIVIDER CIRCUIT

RELATED APPLICATIONS

Pursuant to 35 U.S.C. §119(e), this application claims the benefit of the filing date of Provisional U.S. Patent Application Ser. No. 61/046,990 filed on Apr. 22, 2008, which is incorporated by reference herein.

BACKGROUND OF THE INVENTION

1. Field of the Invention

The present invention relates to a voltage divider circuit, which divides an input voltage in accordance with a predetermined ratio to output the divided voltages.

2. Description of the Related Art

Conventionally, there has been used a voltage divider circuit, which divides, in accordance with a set ratio, an input voltage into predetermined voltages to be used in an internal circuit or the like.

As the voltage divider circuit, in order to generate an accurate potential difference, there is generally used a resistive voltage divider circuit, in which resistors (for example, 500, 501, and 502) are connected in series as illustrated in FIG. 3, for dividing a voltage input from a voltage source or a signal source in accordance with a ratio of resistance values thereof, and for outputting the divided voltages. There have been proposed various circuit configurations (for example, see JP 02-250514 A).

However, the resistive voltage divider circuit is configured by connecting the resistors in series between the input signal source and a ground point. Accordingly, power is consumed for the dividing of voltage.

Moreover, in the case where the voltage divided by the resistive voltage divider circuit is supplied to a load circuit which uses this voltage, when a source current fed from the load circuit or a sink current fed to the load circuit is generated, a voltage drop occurs in a voltage divider resistor, and a resistance ratio of the divided voltages is changed in an equivalent manner, whereby a divided voltage value cannot be obtained accurately.

For this reason, the resistive voltage divider circuit is incapable of dividing a voltage with high accuracy in the case of high impedance at which the input signal source cannot supply power or the case where a load current needs to be supplied from the voltage divider circuit.

SUMMARY OF THE INVENTION

The present invention has been made in view of the above-mentioned circumstances, and therefore an object thereof is to provide a voltage divider circuit for dividing an input voltage in accordance with a predetermined ratio with high accuracy, in which a source current does not flow from a voltage source and a sink current does not flow into the voltage source.

A voltage divider circuit according to the present invention includes: a first resistor; a constant current circuit for outputting a current flowing through the first resistor correspondingly to an input voltage as a constant current; a first current mirror circuit, in which the constant current becomes an input current, for outputting a first output current; a second current mirror circuit, in which the first output current becomes an input current, for outputting a second output current; and a second resistor connected to an output terminal to which the second output current of the second current mirror circuit is output, in which a potential difference generated at both ends of the second resistor is adjusted by a current mirror ratio between the first current mirror circuit and the second current mirror circuit, and a resistance ratio between the second resistor and the first resistor, and the potential difference is output as a divided voltage of the input voltage.

In the voltage divider circuit according to the present invention, the constant current circuit includes: an operational amplifier in which the input voltage is input to a non-inverting input terminal thereof and an inverting input terminal thereof is grounded via the first resistor; and a first metal-oxide-semiconductor (MOS) transistor in which a gate thereof is connected to an output terminal of the operational amplifier and a source thereof is connected to the inverting input terminal of the operational amplifier, for outputting the constant current from a drain thereof.

In the voltage divider circuit according to the present invention: the first current mirror circuit includes a second MOS transistor in which a source thereof is connected to a power source and a gate thereof is connected to a drain thereof, and a third MOS transistor in which a source thereof is connected to the power source and a gate thereof is connected to the drain of the second MOS transistor; and the constant current flows from the drain of the second MOS transistor, and the first output current flows from a drain of the third MOS transistor.

In the voltage divider circuit according to the present invention: the second current mirror circuit includes a fourth MOS transistor in which a source thereof is grounded and a gate thereof is connected to a drain thereof, and a fifth MOS transistor in which a source thereof is grounded and a gate thereof is connected to the drain of the fourth MOS transistor; and the first output current flows into the drain of the fourth MOS transistor, and the second output current flows from a drain of the fifth MOS transistor via the second resistor.

The voltage divider circuit according to the present invention further includes a sixth MOS transistor in which a drain thereof is connected to the power source, a gate thereof is applied with the input voltage, and a source thereof is connected to the drain of the fifth MOS transistor via the second resistor.

According to the present invention, the sink current and the source current do not flow between the voltage divider circuit and the current source or the signal source because the resistor is not used for the input stage. As a result, the input voltage can be divided into divided voltages at the predetermined ratio with high accuracy without changing a voltage of the current source or the signal source and also without increasing power consumption of the current source and the signal source.

Further, according to the present invention, a voltage division ratio of the input voltage can be set by using not only the resistance ratio as in the case of the conventional case but also the current mirror ratio between the first current mirror circuit and the second current mirror circuit. When only the resistance value is compared, there can be achieved a greater degree of freedom within a predetermined range of the voltage division ratio.

Further, according to the present invention, a voltage other than that of the voltage source which outputs the input voltage to be divided or the signal source, and hence the input voltage can be divided into divided voltages in accordance with a predetermined ratio with high accuracy without increasing power consumption of the current source and the signal source.

DETAILED DESCRIPTION OF THE PREFERRED EMBODIMENT

Figure 1:
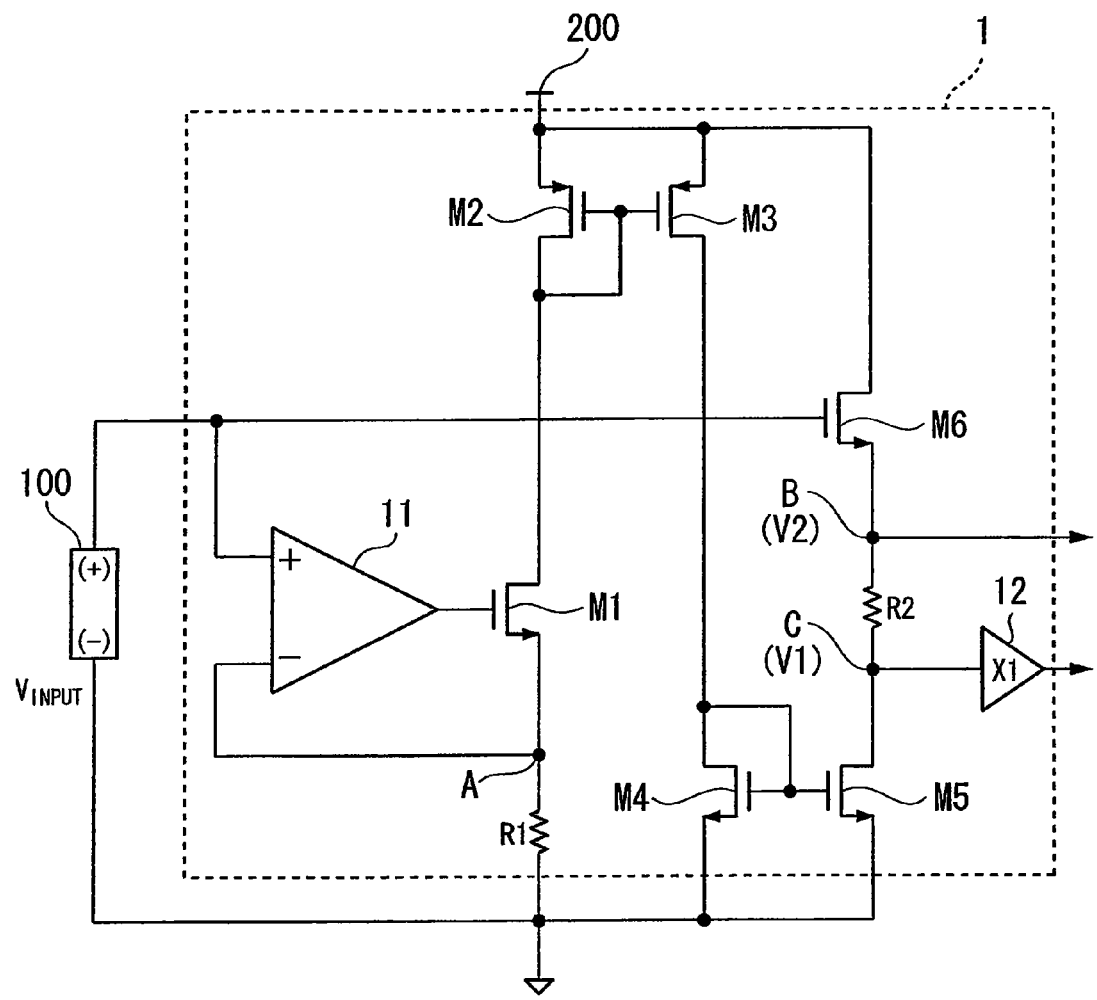
FIG. 1 is a block diagram illustrating a configuration example of a voltage divider circuit according to an embodiment of the present invention.

Hereinafter, a voltage divider circuit according to an embodiment of the present invention is described with reference to the drawings. FIG. 1 is a block diagram illustrating a configuration example of a voltage divider circuit 1 according to this embodiment. This embodiment relates to a configuration of a voltage divider circuit for outputting a minute potential difference not on a ground voltage basis, but at an intermediate potential.

In FIG. 1, the voltage divider circuit 1 according to this embodiment includes an operational amplifier 11, a resistor R1, a resistor R2, MOS transistors M1, M2, M3, M4, M5, and M6, and a buffer 12. Here, the MOS transistors M1, M4, M5, and M6 are n-channel type MOS transistors, and the MOS transistors M2 and M3 are p-channel type MOS transistors. Further, the buffer 12 is a buffer amplifier having a gain of "1", and is provided for preventing a voltage value from changing due to lack of current capacitance in the case where power is supplied to a load circuit having a low input impedance, or a case where a current is supplied via the resistor R2.

In the operational amplifier 11, a non-inverting input terminal (positive) thereof is connected to a positive terminal of a voltage source (or signal source) 100 (having a voltage value Vdd), a power source voltage having a voltage value VINPUT is applied to the non-inverting input terminal, and an inverting input terminal (negative) thereof is grounded via the resistor R1 (having a resistance value r1). A negative terminal of the voltage source 100 is grounded as well (voltage follower configuration).

In the MOS transistor M1, a gate thereof is connected to an output terminal of the operational amplifier 11, and a source thereof is connected to the inverting input terminal of the operational amplifier 11 at a connection point A. Here, in the resistor R1, one end thereof is connected to the connection point A, and the other end thereof is grounded.

The operational amplifier 11, the resistor R1, and the MOS transistor M1 form a constant current circuit. In this constant current circuit, the operational amplifier 11 applies an output voltage to the gate of the MOS transistor M1 so that a voltage at the connection point A is equal to the voltage value VINPUT of an input voltage, and feeds a drain current to the MOS transistor M1. The drain current becomes a constant current.

In the MOS transistor M2, a source thereof is connected to a power source 200, a gate thereof is connected to a drain thereof, and the drain is connected to a drain of the MOS transistor M1.

In the MOS transistor M3, a source thereof is connected to the power source 200, and a gate thereof is connected to the drain of the MOS transistor M2. The power source 200 is a voltage source which is different from the power source 100.

The MOS transistor M1 and the MOS transistor M2 form a first current mirror circuit, and in the first current mirror circuit, when the constant current is input as an input current to the drain of the MOS transistor M2 (that is, when the constant current flows through the MOS transistor M2 as a drain current), a first output current corresponding to a current ratio n1 between the MOS transistor M2 and the MOS transistor M3 (ratio of the drain current which flows in the case where the same gate voltage is applied) is output from the drain of the MOS transistor M3.

In the MOS transistor M4, a drain thereof is connected to a gate thereof and is also connected to the drain of the MOS transistor M3, and a source thereof is grounded.

In the MOS transistor M5, a gate thereof is connected to the drain of the MOS transistor M4, and a source thereof is grounded.

The MOS transistor M4 and the MOS transistor M5 form a second current mirror circuit, and in the second current mirror circuit, when the first output current is input to the drain of the MOS transistor M4 as an input current (that is, when the first output current flows through the MOS transistor M4 as a drain current), a second output current corresponding to a current ratio n2 between the MOS transistor M4 and the MOS transistor M5 is output from a drain of the MOS transistor M5.

The above-mentioned first current mirror circuit and second current mirror circuit are taken as an example. The current mirror circuit is not limited to a current mirror circuit of this configuration, and a current mirror circuit of other configuration may be used.

In the MOS transistor M6, a drain thereof is connected to the power source 200, a gate thereof is applied with an input voltage output by the voltage source 100, and a source thereof is connected to one end of the resistor R2 at a connection point B.

In the resistor R2, the other end thereof is connected to the drain of the MOS transistor M5 at a connection point C.

As described above, in this embodiment, input stages applied with an input voltage to be divided are only the non-inverting input terminal of the operation amplifier 11 and the gate of the transistor M6, and each thereof has a high input impedance. Accordingly, a source current and a sink current are not generated in the voltage source 100 as in a conventional case, and the voltage value VINPUT of the input voltage output from the voltage source 100 is not changed.

The voltage divider circuit according to this embodiment outputs a potential difference V2−V1 between the connection point B (having voltage value V2 of the output voltage) and the connection point C (having voltage value V1 of the output voltage) as a divided voltage obtained by dividing the input voltage.

An output resistance of the connection point B nearly becomes an on-resistance of the MOS transistor M6, that is, an inverse number of a transconductance gm.

On the other hand, an output resistance at the connection point C nearly becomes the resistance value r2 of the resistor R2, and as described above, an output voltage can be output from the connection point C with low output resistance by means of the buffer 12 having the gain of "1".

Here, a voltage value of the power source 200 needs to be set to be higher than a voltage value obtained by adding a threshold voltage of the MOS transistor 6 to the voltage value VINPUT of the output voltage of the power source 100.

With the configuration described above, a drain current represented by the following Equation (1), that is, a constant current IM1 flows through the MOS transistor M1.

$$IM1 = VINPUT/r1 \qquad (1)$$

Further, when a current mirror ratio between the first current mirror circuit and the second current mirror circuit is n (=n1×n2), a drain current flowing through the MOS transistor M6, that is, a second output current IM6 is obtained by the following Equation (2). In this embodiment, n<1 is set to divide the input voltage.

$$IM6=(VINPUT/r1)\cdot n \quad (2)$$

When a voltage at the connection point B is V2 and a voltage at the connection point C is V1, a potential difference between divided voltages, of this embodiment, of the connection point B and the connection point C, that is, a potential difference (V2−V1) between the terminals of the resistor R2 is obtained by the following Equation (3).

$$V2-V1=VINPUT\cdot(r2/r1)\cdot n \quad (3)$$

The voltage V2 has a voltage value obtained by subtracting a voltage VGS between the gate and the source of the MOS transistor M6 (threshold voltage of the MOS transistor M6) from the voltage value VINPUT of the input voltage. As apparent from Equation (3), a voltage division ratio of the input voltage can be appropriately controlled in a wide range when the resistor R1 and the resistor R2 are set to have a certain resistance ratio and the current mirror ratio n is changed.

Here, due to variations in manufacturing process, the resistance values of the respective resistors may vary to a large extent with respect to a design value depending on a size of the resistor, and accordingly, an absolute value of a resistance ratio may be changed and the voltage division ratio may not be controlled with high accuracy. This tendency becomes conspicuous when the voltage division ratio is increased, and as the ratio of the resistance values between the resistors increases.

On the other hand, a ratio of the current values between the MOS transistors can be controlled in a smaller range compared with the variations in resistance value by adjusting a side of the MOS transistor. Accordingly, compared with the case where the resistance value is changed to adjust the voltage division ratio, the voltage division ratio can be adjusted more accurately in a wider range through change of the current mirror ratio n.

Specifically, in the case of increasing the voltage division ratio, an extremely large area is required as a region in which the resistors are formed when the difference of the resistance values between the resistor R1 and the resistor R2 is increased, and the sizes thereof are determined so that an absolute value of the resistance value ratio between the resistor R1 and the resistor R2 is stabilized. On the other hand, when the current ratio is adjusted by the MOS transistor in place of the resistor, the size of the MOS transistor, which is required for stabilizing the absolute value of the current ratio, can be set smaller compared with the case where the similar current ratio is obtained by using the resistor.

Further, when the resistor R1 and the resistor R2 are formed in a size in which the resistance value ratio therebetween is stabilized, the resistance values thereof change in a similar manner due to temperature characteristics, and hence, the temperature characteristics of the resistance value ratio can be maintained.

Therefore, according to this embodiment, the voltage divider circuit which outputs a constant divided voltage can be obtained without depending on fluctuations in voltage of the voltage source, fluctuations in temperature as use environment, and fluctuations in manufacturing process. In addition, as to the MOS transistors, electrical characteristics change in a similar manner between the MOS transistors with respect to the fluctuations in voltage of the voltage source, the fluctuations in temperature as use environment, and the fluctuations in manufacturing process. Accordingly, the absolute value of the current value ratio (for example, above-mentioned n1 or n2) can be maintained.

Next, in the voltage divider circuit according to this embodiment, the enhancement-type MOS transistor M6 has a voltage VGS between the gate and the source thereof, and thus the voltage value VINPUT of the input voltage needs to be made higher than at least the voltage VGS between the gate and the source thereof for generating the divided voltage.

Here, when the MOS transistor M6 is displaced by a depletion-type MOS transistor (of n-channel type) which has a pinch-off voltage Vp of a minus value, the lowest value of the input voltage value VINPUT can be made to be equal to or larger than a saturation voltage VDSSAT of the MOS transistor M5. In addition, the largest value of the input voltage value VINPUT becomes a value obtained by subtracting the saturation voltage VDSSAT of the MOS transistor M6 from the voltage value of the power source 200.

Further, when the MOS transistor M1 of the normal enhancement-type is replaced by one of the depletion type as in the case of the MOS transistor M6, the MOS transistor M1 is capable of operating even when the voltage value VINPUT of the input voltage is "0" V. However, even when the output stage of the operational amplifier 11 is in class AB operation, the voltage value VINPUT of the input voltage needs to be equal to or larger than the saturation voltage VDSSAT of the MOS transistor M1 in consideration of the ground potential.

From the above-mentioned reason, a range of an input voltage CMVINPUT of the operational amplifier 11 in a common mode can be set as follows.

In the case where the MOS transistors M1 and M6 are depletion type (0V)+(VDSAT)<CMVINPUT<(Vdd)−(VDSSAT)

In the case where the MOS transistors M1 and M6 are enhancement type (VGS)+(VDSAT)<CMVINPUT<(Vdd)−(VGS)

Next, the operational amplifier 11 of FIG. 1 is required to use a differential amplifier of a type in which an input stage with respect to an input voltage is formed of the gate of the MOS transistor, which is capable of setting an input impedance extremely high. For example, the operational amplifier 11 is formed of, for example, a constant voltage circuit, a differential amplifier circuit, and an output circuit illustrated in FIG. 2.

The constant voltage circuit includes a constant power source I1, a MOS transistor M18, a MOS transistor M19, a MOS transistor M20, a MOS transistor M21, a MOS transistor M26, and a MOS transistor M27.

Here, the MOS transistor M18, the MOS transistor M19, and the MOS transistor M20 are n-channel type, and the MOS transistor M21, the MOS transistor M26, and the MOS transistor M27 are p-channel type.

The differential amplifier circuit includes a MOS transistor M11, a MOS transistor M12, a MOS transistor M13, a MOS transistor M14, a MOS transistor M15, a MOS transistor M16, a MOS transistor M22, a MOS transistor M23, a MOS transistor M24, a MOS transistor M28, a MOS transistor M29, and a MOS transistor M30.

Here, the MOS transistor M11, the MOS transistor M12, the MOS transistor M13, the MOS transistor M14, the MOS transistor M15, the MOS transistor M16, the MOS transistor M22, the MOS transistor M23, the MOS transistor M24, the MOS transistor M28, the MOS transistor M29, and the MOS transistor M30 are p-channel type, and the MOS transistor M15 and the MOS transistor M16 are n-channel type.

The output circuit includes a MOS transistor M17, a MOS transistor M25, and a capacitor C1. Here, the MOS transistor M25 is p-channel type, and the MOS transistor 17 is n-channel type.

The differential amplifier circuit and the output circuit are driven by a constant voltage generated by the constant voltage circuit, and a voltage difference between an inverting input terminal and a non-inverting input terminal is amplified.

In FIG. 1, the circuit is configured to have a voltage follower configuration in which, as imaginary short, the output voltage is output so that a voltage difference between the inverting input terminal and the non-inverting input terminal is "0".

It is the most important in the operational amplifier 11 that it is formed of the MOS transistor and the inverting input terminal (negative) and the non-inverting input terminal (positive) thereof are connected to the gate of the MOS transistor.

Thanks to this, an input impedance of the inverting input terminal and the non-inverting input terminal of the operational amplifier 11 can be increased, with the result that the sink current or the source current is not generated with respect to the power source 100, and that the voltage value VINPUT is not changed.

Figure 2:
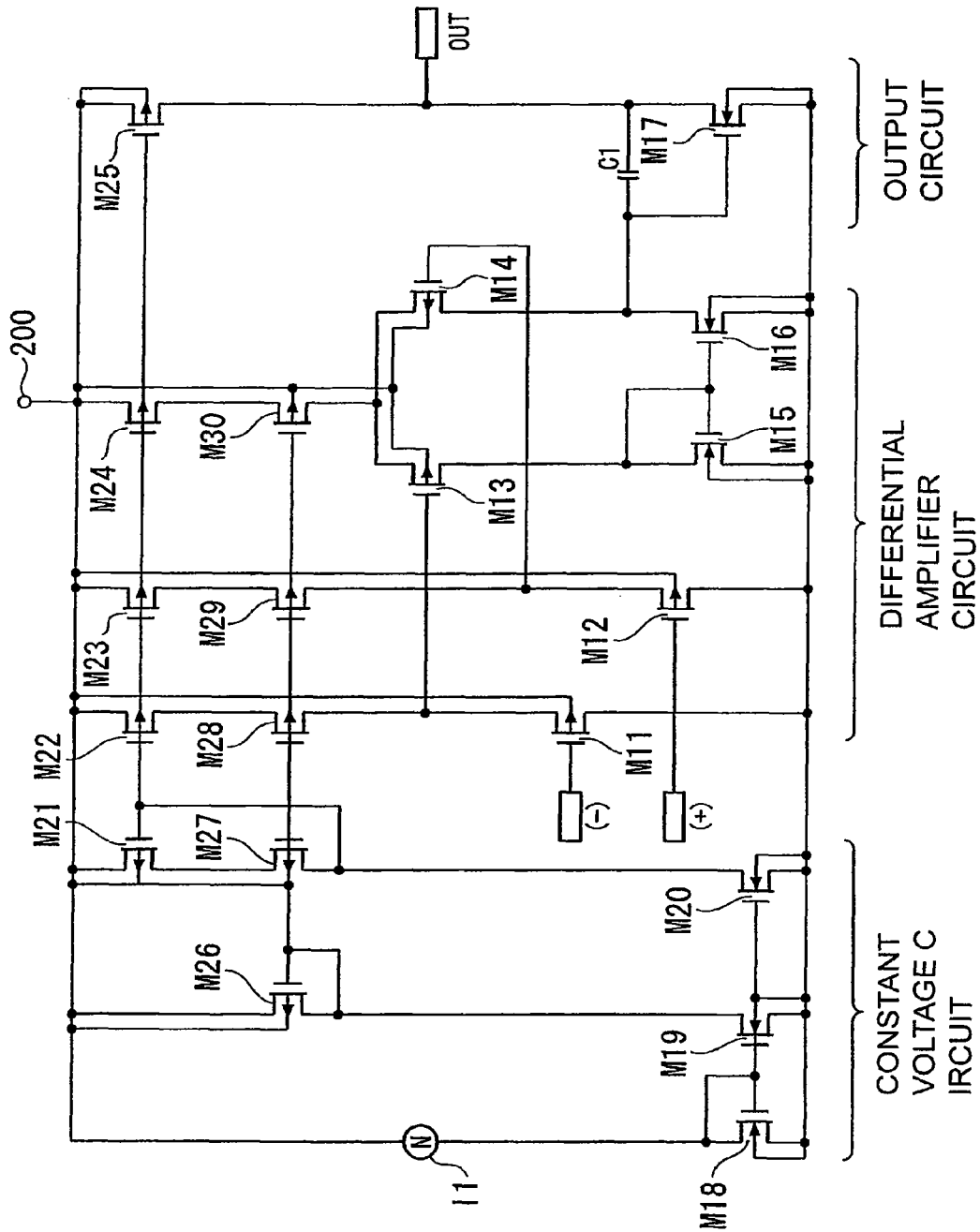
FIG. 2 is a block diagram illustrating a configuration example of an operational amplifier of FIG. 1.
Figure 3:
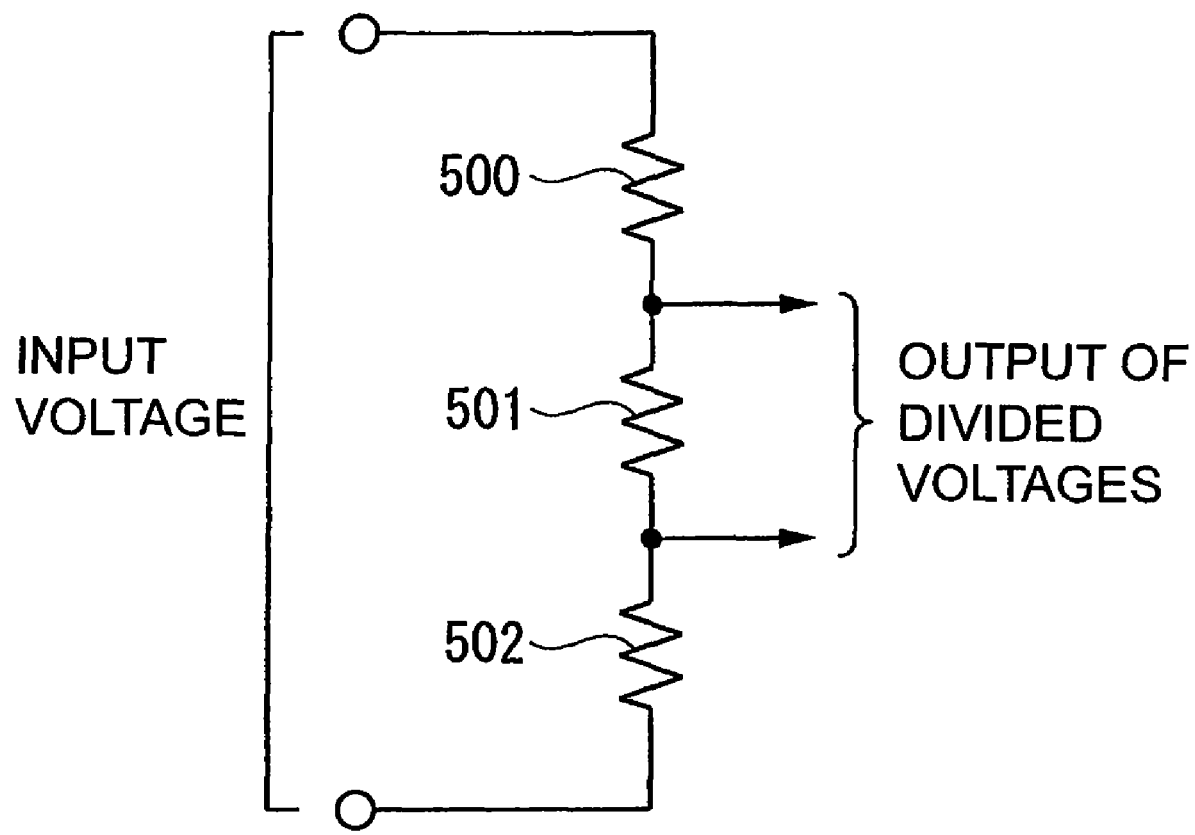
FIG. 3 is a circuit diagram illustrating a configuration of a conventional resistive voltage divider circuit.

The operational amplifier 11 of FIG. 2 described above is taken as an example, and a circuit having any configuration may be used as long as it is of type having a high input impedance to an extent that the sink current or the source current is not generated with respect to the power source 100 and the voltage value VINPUT of the input voltage is not changed.

What is claimed is:

1. A voltage divider circuit, comprising:
    a first resistor;
    a constant current circuit for outputting a constant current flowing through the first resistor correspondingly to an input voltage;
    a first current mirror circuit responsive to the constant current to output a first constant current;
    a second current mirror circuit responsive to the first constant current to output a second constant current;
    a second resistor through which the second constant current flows, wherein a potential difference across the second resistor is a function of a current mirror ratio between the first current mirror circuit and the second current mirror circuit, and a resistance ratio between the second resistor and the first resistor; and
    a MOS transistor having a source connected to the second resistor and turned on to flow the second constant current through the second resistor, the MOS transistor having a gate being biased at the input voltage so that the potential difference becomes a divided voltage of the input voltage.

2. A voltage divider circuit according to claim 1, wherein the constant current circuit includes:
    an operational amplifier in which the input voltage is input to a non-inverting input terminal thereof and an inverting input terminal thereof is grounded via the first resistor; and
    a first MOS transistor for outputting the constant current from a drain thereof, in which a gate thereof is connected to an output terminal of the operational amplifier and a source thereof is connected to the inverting input terminal of the operational amplifier.

3. A voltage divider circuit according to claim 1, wherein:
    the first current mirror circuit includes:
    a second MOS transistor in which a source thereof is connected to a power source and a gate thereof is connected to a drain thereof; and
    a third MOS transistor in which a source thereof is connected to the power source and a gate thereof is connected to the drain of the second MOS transistor; and
    the constant current flows from the drain of the second MOS transistor, and the first constant current flows from a drain of the third MOS transistor.

4. A voltage divider circuit according to claim 1, wherein:
    the second current mirror circuit includes:
    a fourth MOS transistor in which a source thereof is grounded and a gate thereof is connected to a drain thereof; and
    a fifth MOS transistor in which a source thereof is grounded and a gate thereof is connected to the drain of the fourth MOS transistor; and
    the first constant current flows into the drain of the fourth MOS transistor, and the second constant current flows from a drain of the fifth MOS transistor via the second resistor.

5. A voltage divider circuit according to claim 4, wherein the MOS transistor is a sixth MOS transistor in which a drain thereof is connected to a power source, and a source thereof is connected to the drain of the fifth MOS transistor via the second resistor.

* * * * *